United States Patent [19]

Art et al.

[11] Patent Number: 5,085,362
[45] Date of Patent: Feb. 4, 1992

[54] GRAVITY-HELD ALIGNMENT MEMBER FOR MANUFACTURE OF A LEADLESS CHIP CARRIER

[75] Inventors: Jack Art, Modesto, Calif.; Douglas J. Levad, Colorado Springs, Colo.

[73] Assignee: Atmel Corporation, San Jose, Calif.

[21] Appl. No.: 642,031

[22] Filed: Jan. 16, 1991

[51] Int. Cl.⁵ .............................................. B23K 1/14
[52] U.S. Cl. ...................... 228/49.1; 228/122; 228/123; 29/827; 29/760; 29/840
[58] Field of Search ............... 228/49.1, 122, 123, 228/180.2; 29/827, 840, 760

[56] References Cited

U.S. PATENT DOCUMENTS

| | | | |
|---|---|---|---|
| 3,695,502 | 10/1972 | Gaiser | 228/49.1 X |
| 4,371,912 | 2/1983 | Guzik | 228/180.2 |
| 4,512,509 | 4/1985 | Ellis, Jr. et al. | 228/49.1 X |
| 4,646,435 | 3/1987 | Grassauer | 228/180.2 X |
| 4,804,130 | 2/1989 | Kwan et al. | 228/6.2 |
| 4,836,434 | 6/1989 | Takenaka et al. | 228/179 |
| 5,014,418 | 5/1991 | Wright | 29/827 |

Primary Examiner—Richard K. Seidel
Assistant Examiner—Patty E. Hong
Attorney, Agent, or Firm—Schneck & McHugh

[57] ABSTRACT

An alignment apparatus for use in sealing of a package lid to a base of an integrated circuit package. A fabrication boat for leadless chip carriers includes a plurality of arrays of upwardly extending fingers disposed to secure a base of a leadless chip carrier. An alignment member is slidably fit over the carrier base and the upwardly extending fingers. Each alignment member includes shoulders, each shoulder having a lower vertical surface in contact with the carrier base and having a horizontal surface resting upon the carrier base. Upper vertical surfaces of the shoulders are spaced apart to slidably receive a package lid for alignment with the base. The package lids are held within the alignment member primarily by gravitational force.

13 Claims, 1 Drawing Sheet

GRAVITY-HELD ALIGNMENT MEMBER FOR MANUFACTURE OF A LEADLESS CHIP CARRIER

DESCRIPTION

1. Technical Field

The present invention relates generally to the assembly of an integrated circuit package and more particularly to aligning a package lid to a base of an integrated circuit package.

2. Background Art

After interconnection of a semiconductor die to an integrated circuit package, many packages must be hermetically sealed to protect the device from external contaminants. In package fabrication, hermeticity is defined as the ability to pass a vacuum leak test and also to exclude external contaminants for a long period of time. Typical sealing materials include glass, metal and various polymers.

A method and apparatus for hermetically sealing a package lid to an integrated circuit package is described in Takenaka et al U.S. Pat. No. 4,836,434. The patent teaches use of a retainer to hold a package lid and to adjust the positional relation of the lid with respect to a base of the integrated circuit package. The retainer and the package are housed within a receptacle that controls both the atmosphere and the temperature of the operation. The temperature is raised until solder preforms provided at the seal portions of the lid and the base are melted. The retainer then lowers the lid to join the preforms. The lid is lowered at a speed that prevents scattering of the solder. The Takenaka et al. reference is designed for the sealing of multi-chip modules, and works well for this purpose. However, the apparatus may be cost prohibitive in the manufacture of single-chip packages. The Takenaka et al. apparatus is designed to handle a single package at a time and requires a relatively expensive vacuum chamber and controller for regulating temperature and pressure.

A more common technique is to use spring clips to provide a pressure to hold a package lid to a package base during the sealing operation. A spring clip acts in the same manner as tweezers, but the two fingers are biased together. The biasing retains the lid to the base, whereafter the physically clipped package is placed onto a furnace belt to cause the reflow of solder for bonding the lid to the base. One problem of utilization of the spring clips is that, like the Takenaka et al. method, each integrated circuit package must be individually handled. This is a labor-intensive process. A second problem is that the pressure required to ensure that the lid remains in alignment with the base may cause damage to the device. This is particularly true in the packaging of erasable programmable read only memory chips (EPROM). At least a portion of the lid of an EPROM is made of glass. The glass may be scratched, cracked or completely broken by the pressure exerted by the spring clip. Even a small crack may cause contamination of the semiconductor device within the package. Moreover, a scratch will limit the reliability of erasability of the device.

Kwan et al. U.S. Pat. No. 4,804,130 teaches a chip carrier sealing and bonding fixture designed to overcome some of the problems associated with use of spring clips. The fixture captively locates a number of chip carriers and lids within recessed pockets. A tension plate having a number of convex protrusions is mounted to the fixture so that each convex protrusion presses against a center of a chip carrier. Mounting nuts are then tightened to support screws to maintain the positional relationship between the tension plate and the fixture, thereby securing the chip carriers in position. The invention of Kwan et al. permits batch processing of the sealing of lids to bases of chip carriers. However, the use of the prior art device requires bolting and unbolting of the individual parts and, like the spring clips, requires the application of pressure to secure the package base to the package lid. As noted above, the application of pressure may lead to scratching, breaking, cracking and contamination problems.

It is an object of the present invention to provide an apparatus for the sealing of a package lid to a base of an integrated circuit package, wherein labor requirement and parts handling is reduced with respect to the prior art and wherein alignment of the lid and the base is not operator dependent.

SUMMARY OF THE INVENTION

The above object has been met by an apparatus in which a lid of an integrated circuit package is secured with respect to horizontal displacement by a slidably fit member, but which is not clamped into contact with the base of the package. Rather, the lid is restricted from vertical movement by gravitational force.

The apparatus includes a fabrication boat for leadless chip carriers. The boat includes upwardly extending fingers disposed to secure the base of the leadless chip carrier. Preferably, the boat includes a plurality of arrays of the upwardly extending fingers, with each array being capable of securing a base. In this manner the leadless chip carriers may be batch processed.

An alignment member having opposed first and second major sides slidably receives the base of the package and the fingers which support the package. The alignment member has an opening which extends through the member from the first major side to the second major side. A lower level of the alignment member is configured such that the opening is partially defined by vertical walls which contact the package base. An upper level includes shoulders having horizontal walls which contact the surface of the package base and have vertical walls. Upon positioning of the alignment member over the package base, a package lid may be slidably fit into the upper level of the alignment member. The vertical walls of the shoulders provide horizontal registration of the lid to the base. The fabrication boat may then be inserted into a heating area which causes solder reflow at the sealing junction of the lid and the base.

An advantage of the present invention is that the force which retains the package lid to the package base is a gravitational force provided by the mass of the package lid. Therefore, there is no external member which provides a compression force having the potential of damaging either the base or the lid. The present invention improves the production yield. Moreover, reliability is also improved. Damage which may not be detectable upon examination can still cause contamination to enter the device. For example, a minute crack in the package can result in particulate matter from the package settling on the integrated circuit device. Because of the microminiaturization of devices, even minute particulates cause defects.

Another advantage is that securing hardware is not necessary. Batch processing becomes an easy matter.

Bases of the integrated circuit packages are slidably fit within the arrays of upwardly extending fingers. The alignment members are then fitted over the bases and the fingers. Finally, the package lids are received within the shoulders of the alignment member. Thus, the procedure is a simple three-step operation which does not require the fastening and unfastening of hardware before or after bonding of the package lid to the package base.

BEST MODE FOR CARRYING OUT THE INVENTION

Figure 1:
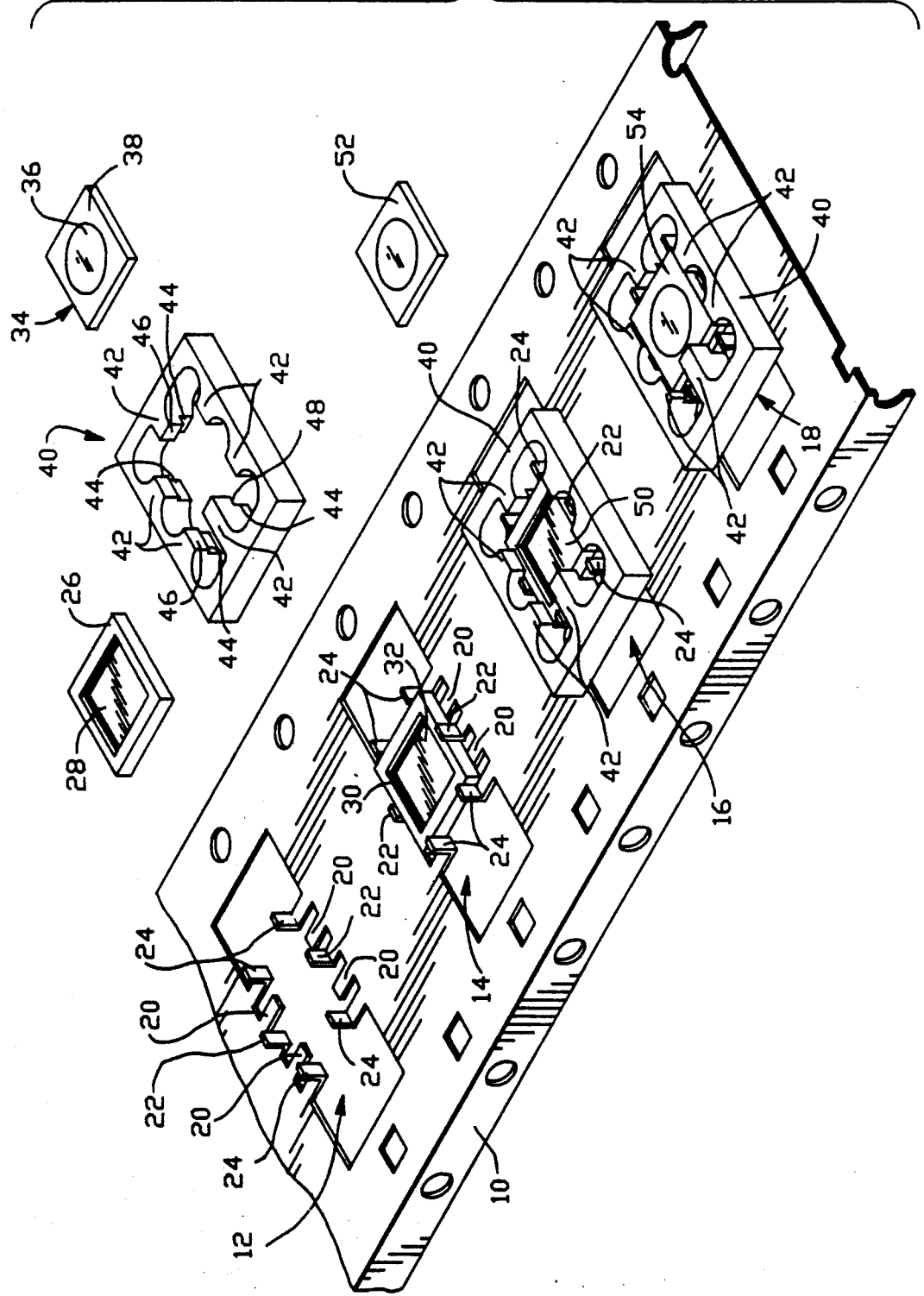
FIG. 1 is a perspective view of an apparatus for the alignment of a leadless chip carrier and a package lid in accord with the present invention.

Referring to FIG. 1, a fabrication boat 10 is shown as including a plurality of package retainer regions 12, 14, 16 and 18. As best seen in the first retainer region 12, each retainer region includes an array of horizontal fingers 20 and an array of L-shaped fingers 22 and 24. The fabrication boat 10 is a commercially available product.

A first base 26 of a leadless chip carrier is shown positioned for insertion into the first package retainer region 12. The first base 26 includes a die-receiving cavity 28. For purposes of simplification, no semiconductor die is shown as being bonded within the die-receiving cavity 28. The horizontal fingers 20 of the package retainer region 12 have an extent to ensure that the first base 26 is supported within the fabrication boat 10. The center L-shaped fingers 22 prevent motion of the first base in a direction parallel to the length of the fabrication boat. The remaining L-shaped fingers 24 are disposed to prevent motion of the first base perpendicular to the length of the fabrication boat. Capture of a second base 30 of a leadless chip carrier by the L-shaped fingers 22 and 24 is illustrated in the second package retainer region 14 of FIG. 1. A small amount of play is allowed for movement of the second base 30.

The second base 30 of the leadless chip carrier is slidably received within the second package retainer region 14. After bonding of a semiconductor die within the die-receiving cavity 32 of the second base 30, it is important to protect the die from external contaminants. Many integrated circuit packages are hermetically sealed with glass, metal or a polymer. A first package lid 34 is shown as being positioned for sealing of the die-receiving cavity 32. The first package lid includes a center region 36 made of glass and a peripheral region 38 made of metal. The glass central region is important in many applications. For example, erasable programmable read only memory (EPROM) chips may require entrance of ultraviolet light.

Hermetically sealing the semiconductor die within the die-receiving cavity 32 of the second base 30 requires proper alignment of the first package lid 34 to the second base 30. A problem experienced in the industry is that of securing the first package lid to the second base without damage to the two components of the package. The glass center region 36 of the first package lid is particularly susceptible to damage. A scratch to the glass will jeopardize the ability of erasure of the EPROM. Cracking of the package lid or the second base may introduce particulate matter into the semiconductor die, thereby rendering the die defective.

To provide alignment without jeopardizing production yield, an alignment member 40 is utilized to seat the first package lid 34 against the second base 30 of the leadless chip carrier. The alignment member is made of stainless steel, but this is not critical. The alignment member has a length of 1 inch, a width of 0.48 inch and a height of 0.125 inch.

A hole penetrates the alignment member 40 from the first major surface to the second major surface. The opening approaches an H-shape. A total of six shoulders 42 determines the configuration of the opening. Each shoulder has a lower vertical surface 44 and an upper vertical surface 46. Thus, the upper level of the alignment member defines an opening having smaller dimensions than the dimensions at the lower level of the alignment member. The lower and upper vertical surfaces 44 and 46 are joined by a horizontal surface 48 on each of the shoulders 42.

The alignment member 40 is placed atop the second base 30 of the integrated circuit package. Each lower vertical surface 44 of the alignment member makes contact with the lateral edges of the second base, while the horizontal surface of each shoulder 42 rests atop the second base. The opening within the alignment member receives the upwardly extending fingers 24 as well as the second base. Positioning of another alignment member 40 on a third base 50 of a leadless chip package is illustrated at the third package retainer region 16. The alignment member does not contact the upwardly extending fingers 22 and 24, but this is not critical since contact with the third base 50 secures the alignment member in position. Thus, the third base and the alignment member are fixed in position with respect to each other. A second package lid 52 may then be inserted into the upper level of the opening of the alignment member. The shoulders 42 of the alignment member are spaced apart to slidably receive the second package lid. The shoulders are dimensioned to permit only a small degree of play for the second package lid 52 to move against the third base 50. The assembly of a fourth base, and alignment member 40 and a third package lid 54 is shown in the last retainer region 18.

As best seen in the last retainer region 18, the third package lid 54 is prevented from moving horizontally by contact with each of the six shoulders 42 of the alignment member 40. The third package lid rests atop the base and is prevented from exiting the alignment member by its own mass. That is, gravitational force maintains the third package lid against the base. No compression force which would jeopardize the integrity of the package is necessary.

After each of the assemblies of a base, an alignment member 40 and a package lid have been completed within the package retainer regions 12-18, the fabrication boat 10 may be inserted into a furnace. Typically, the bases and the package lids each include solder preforms, not shown, along the sealing regions between the two components. The furnace reflows the solder preforms, after which cooling will hermetically seal the package lids to the bases. The assembled leadless chip carriers may then be slidably removed from the alignment members 40 and the fabrication boat 10.

We claim:
1. An apparatus for use in hermetically sealing of a lid to a base of a leadless chip carrier comprising,
 a base of a leadless chip carrier, said base having a die-receiving cavity to house an integrated circuit chip, a carrier lid adapted to be secured to said base to hermetically seal said die-receiving cavity of said base, a support means for retaining said base in a substantially fixed, generally horizontal position, and an alignment member releasably coupled to said support means, said alignment member having first and second levels, said first level having a configuration to receive said base, said second level having a configuration to receive said carrier lid and to maintain said carrier lid in generally fixed horizontal registration with respect to said base, gravitational force thereby being the primary force for maintaining said carrier lid in contact with said base during hermetical sealing of said carrier lid to said base.

2. The apparatus of claim 1 wherein said support means is a fabrication device having positioning means for securing said base, said alignment member having a common opening through said first and second levels, said positioning means extending into said common opening.

3. The apparatus of claim 2 wherein each positioning means is a plurality of upwardly extending fingers disposed to capture said base therebetween.

4. The apparatus of claim 1 wherein said second level of said alignment member has a plurality of shoulders, each shoulder having a horizontal surface positioned to contact said base and having a vertical surface positioned to contact said lid.

5. The apparatus of claim 4 wherein said first level includes vertical surfaces positioned to contact said base.

6. An apparatus for use in sealing of a package lid to a base of an integrated circuit package comprising, a boat for the fabrication of a leadless chip carrier, said boat having upwardly extending fingers disposed to secure a base of said leadless chip carrier in a horizontal position, and an alignment member having opposed first and second major sides, said alignment member having an opening extending therethrough from said first major side to said second major side, said alignment member slidably fit to said boat to receive said base and said upwardly extending fingers in said opening via said first major side, said opening configured to receive a package lid and to horizontally align said package lid with respect to said base, said package lid thereby held within said opening by the gravitational force of the mass of said package lid.

7. The apparatus of claim 6 wherein said alignment member includes shoulders at the periphery of said opening, said shoulders having first vertical surfaces extending from said first major side to contact edges of said base and having horizontal surfaces located to contact the upper surface of said base, said shoulders having second vertical surfaces located to contact edges of said package lid.

8. The apparatus of claim 6 wherein said alignment member is a unitary member.

9. The apparatus of claim 6 wherein said boat includes a plurality of arrays of upwardly extending fingers, each array supporting a base, and wherein said apparatus further comprises a plurality of alignment members, each alignment member being slidably fit to one of said arrays.

10. A method of hermetically sealing a lid to a base of a leadless chip carrier comprising, providing a base and a carrier lid of a leadless chip carrier, providing a support member for retaining said base in a substantially fixed, generally horizontal position, stationing said base on said support member, providing an alignment member having a first level configured to receive said base and having a second level having a configuration to receive said carrier lid and to maintain said carrier lid in generally fixed horizontal relation with respect to said base, sliding said alignment member over said base, thereby resting said alignment member on said support member, inserting said carrier lid into said second level of said alignment member, thereby resting said carrier lid on said base, and without applying a clamping force on said carrier lid, hermetically sealing said carrier lid onto said base.

11. The method of claim 10 wherein said step of inserting said carrier lid is a step including leaving an upper surface of said carrier lid exposed to the ambient atmosphere.

12. The method of claim 10 wherein said step of fixing said base to said support member includes capturing said base between upwardly extending fingers of said support member.

13. The method of claim 12 wherein said step of sliding said alignment member includes inserting said fingers into said first level of said alignment members.

* * * * *